(12) United States Patent
Sung

(10) Patent No.: US 11,387,829 B2
(45) Date of Patent: Jul. 12, 2022

(54) INTEGRATED CIRCUIT AND SIGNAL TRANSMISSION METHOD THEREOF

(71) Applicant: REALTEK SEMICONDUCTOR CORP., Hsinchu (TW)

(72) Inventor: Lien-Hsiang Sung, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/130,999

(22) Filed: Dec. 22, 2020

(65) Prior Publication Data

US 2022/0029624 A1    Jan. 27, 2022

(30) Foreign Application Priority Data

Jul. 27, 2020 (TW) ................................. 109125343

(51) Int. Cl.
*H03K 19/003* (2006.01)
*H03K 5/02* (2006.01)

(52) U.S. Cl.
CPC ............. *H03K 19/003* (2013.01); *H03K 5/02* (2013.01)

(58) Field of Classification Search
None
See application file for complete search history.

(56) References Cited

U.S. PATENT DOCUMENTS

2008/0007315 A1* 1/2008 Huang ........... H03K 19/018528
                                                  327/333
2013/0140905 A1* 6/2013 Huang ..................... G06F 1/26
                                                   307/89

\* cited by examiner

*Primary Examiner* — Jany Richardson
(74) *Attorney, Agent, or Firm* — Birch, Stewart, Kolasch & Birch, LLP

(57) ABSTRACT

An integrated circuit and a signal transmission method thereof are provided. The integrated circuit includes a first power domain, a second power domain, and a weakly pull circuit. The first power domain is powered by a first power source, the second power domain is powered by a second power source, and the second power domain transmits a signal to the first power domain through a transmission path. The weakly pull circuit is signally connected to the transmission path. When the second power domain is in a power-off mode, the weakly pull circuit maintains the transmission path stably at a logic level to prevent unknown signals from entering the first power domain from the second power domain and disturbing the normal operation of the first power domain.

15 Claims, 3 Drawing Sheets

INTEGRATED CIRCUIT AND SIGNAL TRANSMISSION METHOD THEREOF

CROSS-REFERENCE TO RELATED APPLICATION

This non-provisional application claims priority under 35 U.S.C. § 119(a) to Patent Application No. 109125343 in Taiwan, R.O.C. on Jul. 27, 2020, the entire contents of which are hereby incorporated by reference.

BACKGROUND

Technical Field

The present invention is related to an integrated circuit (IC) technology of transmission between different power domains, and in particular, to an integrated circuit and a signal transmission method thereof.

Related Art

During operation of an integrated circuit, in order to reduce energy consumption, the integrated circuit is usually divided into a plurality of power domains, and an unused part power domain in a system is turned off. Therefore, at a same time point, a first power domain is in a power-on mode, and a second power domain is in a power-off mode. However, when the second power domain is powered off, in order to prevent unknown signals (noise) from entering the first power domain from the second power domain and disturbing the logic operation in the first power domain, an isolation cell is disposed between the first power domain and the second power domain in the prior art to avoid interference between different power domains in the power-on mode and in the power-off mode. However, when the integrated circuit cannot control a power-off time, the isolation cell cannot be enabled at a correct time. If the isolation cell is enabled too early, a signal cannot be transmitted between the first power domain and the second power domain, and if the isolation cell is enabled too late, unknown signals likely interfere with the first power domain, causing the isolation unit to be disabled.

SUMMARY

In view of the above, the present invention provides an integrated circuit, including a first power domain, a second power domain, and a weakly pull circuit. The first power domain is powered by a first power source, the second power domain is powered by a second power source, and the second power domain transmits a signal to the first power domain through a transmission path. The weakly pull circuit is signally connected to the transmission path, when the second power domain is in a power-off mode, the weakly pull circuit maintains the transmission path stably at a logic level.

The present invention further provides a signal transmission method applicable to an integrated circuit, the integrated circuit including a first power domain and a second power domain. The signal transmission method includes: supplying, by a first power source, power to the first power domain, and supplying, by a second power source, power to the second power domain; transmitting, by the second power domain, a signal to the first power domain through a transmission path; and when the second power domain is in a power-off mode, maintaining, by a weakly pull circuit, the transmission path stably at a logic level.

According to some embodiments, the first power domain has a first connection pad, the second power domain has a second connection pad, and the second connection pad is electrically connected to the first connection pad to form the transmission path.

According to some embodiments, the weakly pull circuit is located in the first power domain and is electrically connected to the first connection pad or the transmission path.

According to some embodiments, the weakly pull circuit is a weakly pull-high circuit or a weakly pull-low circuit. When the weakly pull circuit is the weakly pull-low circuit, the logic level is a low logic level; and when the weakly pull circuit is the weakly pull-high circuit, the logic level is a high logic level.

According to some embodiments, the first power domain is in a power-on mode, and the second power domain is in the power-on mode or the power-off mode.

According to some embodiments, the first power source and the second power source are a same power source.

In view of the above, a circuit design is directly carried out inside the integrated circuit in the present invention, to use the weakly pull circuit to maintain the transmission path stably at a logic level when a power domain is powered off, thereby preventing unknown signals (including noise) from entering another power domain from the power domain in the power-off mode and disturbing the logic operation of the power domain, to maintain the normal operation of the integrated circuit. Therefore, an isolation cell is not required in the present invention, and a cumbersome isolation setting procedure is not required and a power-off time does not need to be learned in advance. In this way, even if one power domain encounters a sudden power-off event, the logic operation of another power domain is not affected.

DETAILED DESCRIPTION

An integrated circuit and a signal transmission method provided in the present invention are applicable to an integrated circuit having at least two power domains. Through the technology of the present invention, the two power domains in the integrated circuit do not interfere with each other in a power-off mode, thereby maintaining the basic operation of the integrated circuit.

Figure 1:
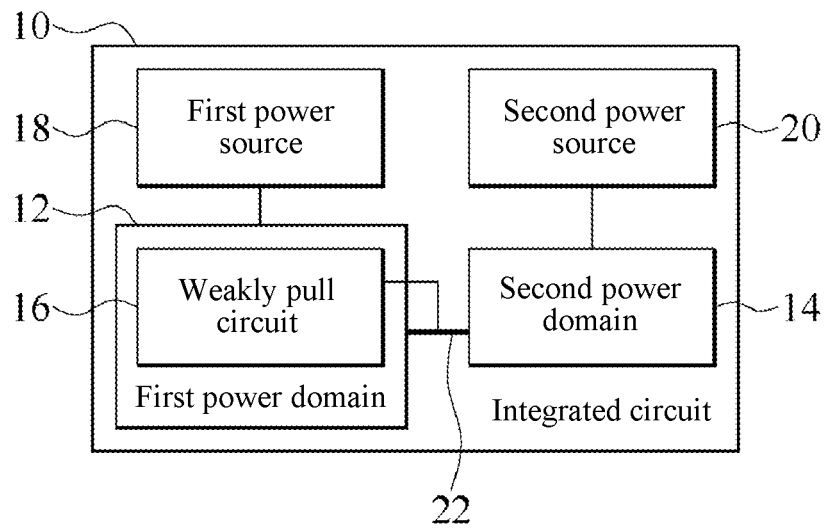
FIG. 1 is a block diagram of an integrated circuit according to an embodiment of the present invention.

FIG. 1 is a block diagram of an integrated circuit according to an embodiment of the present invention. Referring to FIG. 1, an integrated circuit 10 includes a first power domain 12, a second power domain 14, and a weakly pull circuit 16. In this embodiment, the two power domains 12 and 14 are used as an example, but the present invention is not limited thereto. In an embodiment, the first power domain 12 and the second power domain 14 may be a processing unit, a module, a circuit, a part of a circuit, or any combination of different circuits. For example, if the first power domain 12 is a small central processing unit related to wake-up, such as an 8051 processor, the second power domain 14 may be a large central processing unit that processes a main function, such as an ARM processor.

As shown in FIG. 1, in the integrated circuit, the first power domain 12 is powered by a first power source 18, and the second power domain 14 is powered by a second power source 20. The first power domain 12 is in a power-on mode, so that a circuit or a component in the first power domain 12 is normally powered to operate. The second power domain 14 may be in the power-on mode or a power-off mode, so that the second power domain 14 is sometimes in the power-on mode and is normally powered and operated, and is sometimes in the power-off mode with no power supply to save power. A signal is transmitted between the first power domain 12 and the second power domain 14 through a transmission path 22 so that the signal can be transmitted from the second power domain 14 to the first power domain 12 through the transmission path 22. The weakly pull circuit 16 is located in the first power domain 12 and is signally connected to the transmission path 22. During normal working, both the first power domain 12 and the second power domain 14 are in the power-on mode, so that circuits or components in the first power domain 12 and the second power domain 14 are normally powered to operate. In this case, the second power domain 14 may transmit the signal to the first power domain 12 through the transmission path 22. In a power-saving state (for example, a standby state), the first power domain 12 remains in the power-on mode, and the second power source 20 stops supplying power to the second power domain 14 so that the second power domain 14 is in the power-off mode. In this case, the weakly pull circuit 16 may maintain the transmission path 22 stably at a logic level. Because signals on the transmission path 22 are maintained at the logic level, unknown signals (including noise) that may be generated by the second power domain 14 in the power-off mode cannot enter the first power domain 12 through the transmission path 22, to maintain the normal logic operation of the first power domain 12, without interference from the second power domain 14 in the power-off mode.

In an embodiment, the weakly pull circuit 16 is a weakly pull-high circuit or a weakly pull-low circuit. When the weakly pull circuit 16 is the weakly pull-low circuit, the logic level of the transmission path 22 is maintained at a low logic level, and the low logic level is 0. When the weakly pull circuit 16 is the weakly pull-high circuit, the logic level of the transmission path 22 is maintained at a high logic level, and the high logic level is 1.

Figure 2:
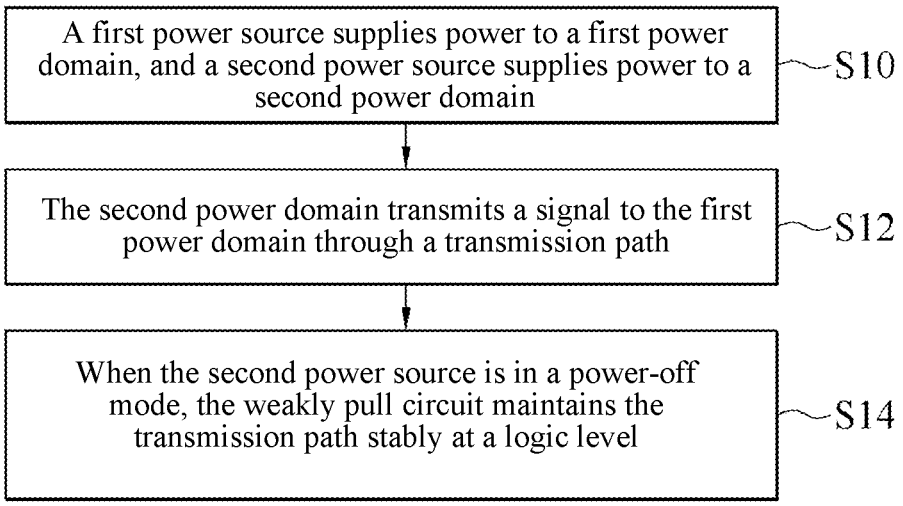
FIG. 2 is a schematic flowchart of a signal transmission method according to an embodiment of the present invention.

FIG. 2 is a schematic flowchart of a signal transmission method according to an embodiment of the present invention. Referring to FIG. 1 and FIG. 2, the signal transmission method for the integrated circuit 10 includes steps S10 to S14. First, as shown in step S10, the first power source 18 supplies power to the first power domain 12, and the second power source 20 also supplies power to the second power domain 14, so that circuits or components in the first power domain 12 and the second power domain 14 can be operated normally. Because both the first power domain 12 and the second power domain 14 are in the power-on mode, as shown in step S12, the second power domain 14 transmits the signal to the first power domain 12 through the transmission path 22. As shown in step S14, when the second power source 20 stops supplying power to the second power domain 14 so that the second power domain 14 is in the power-off mode, the weakly pull circuit 16 may maintain the transmission path 22 stably at the high logic level or the low logic level, to prevent unknown signals from entering the first power domain 12.

Figure 3:
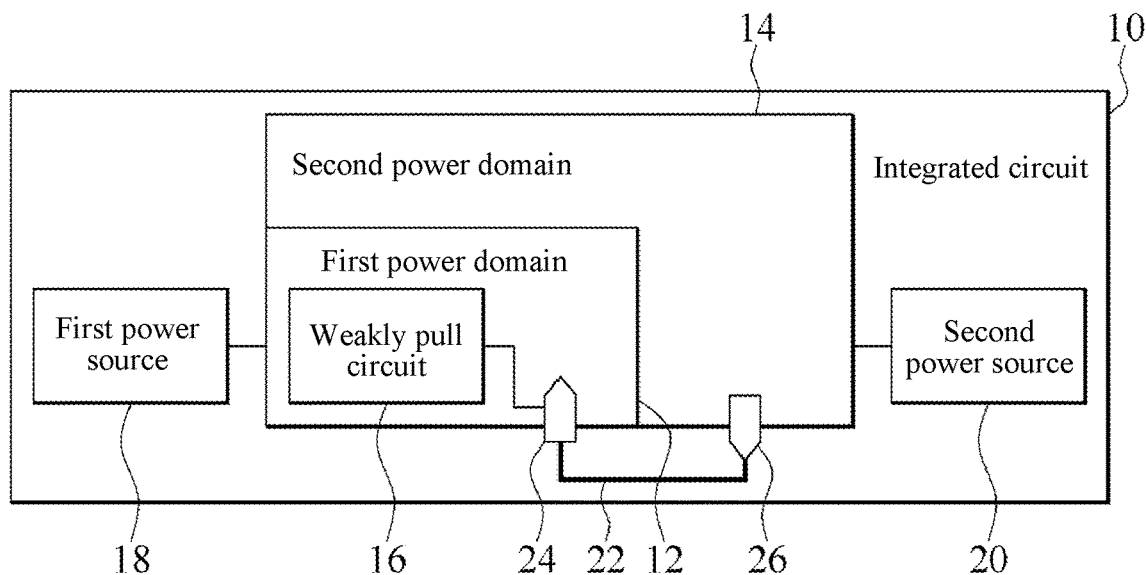
FIG. 3 is a block diagram of an integrated circuit according to another embodiment of the present invention.

In another embodiment, referring to FIG. 3, the integrated circuit 10 has the first power domain 12 and the second power domain 14 adjacent to each other. The first power domain 12 has a first connection pad 24, and the second power domain 14 has a second connection pad 26. The second connection pad 26 is electrically connected to the first connection pad 24 to form the transmission path 22. The weakly pull circuit 16 is also located in the first power domain 12 and is electrically connected to the first connection pad 24 to be signally connected to the transmission path 22 through the first connection pad 24. During normal working, both the first power domain 12 and the second power domain 14 are in the power-on mode, so that circuits or components in the first power domain 12 and the second power domain 14 are normally powered to operate. In this case, the second power domain 14 may transmit the signal to the first power domain 12 sequentially through the second connection pad 26, the transmission path 22, and the first connection pad 24. In a power-saving state (for example, a standby state), the first power domain 12 remains in the power-on mode, and the second power source 20 stops supplying power to the second power domain 14 so that the second power domain 14 is in the power-off mode. In this case, the weakly pull circuit 16 may maintain the transmission path 22 stably at a logic level through the first connection pad 24. Because signals on the transmission path 22 are maintained at the logic level, unknown signals that may be generated by the second power domain 14 in the power-off mode cannot enter the first power domain 12 through the transmission path 22, to maintain the normal logic operation of the first power domain 12. In this way, the first power domain 12 is not interfered by the second power domain 14 in the power-off mode.

In the foregoing embodiment, as shown in FIG. 1 and FIG. 3, the first power source 18 and the second power source 20 are different power sources. The different power sources mentioned herein mean that the first power source 18 and the second power source 20 may be independently controlled or are from different power supply terminals, and these power sources (the first power source 18 and the second power source 20) may have output voltages of a same voltage level or output voltages of different voltage levels. In another embodiment, the first power source 18 and the second power source 20 may be a same power source. In this case, a switch (not shown in the figure) may be disposed between the second power source 20 and the second power domain 14 to cut off power supply to the second power domain 14.

Figure 4:
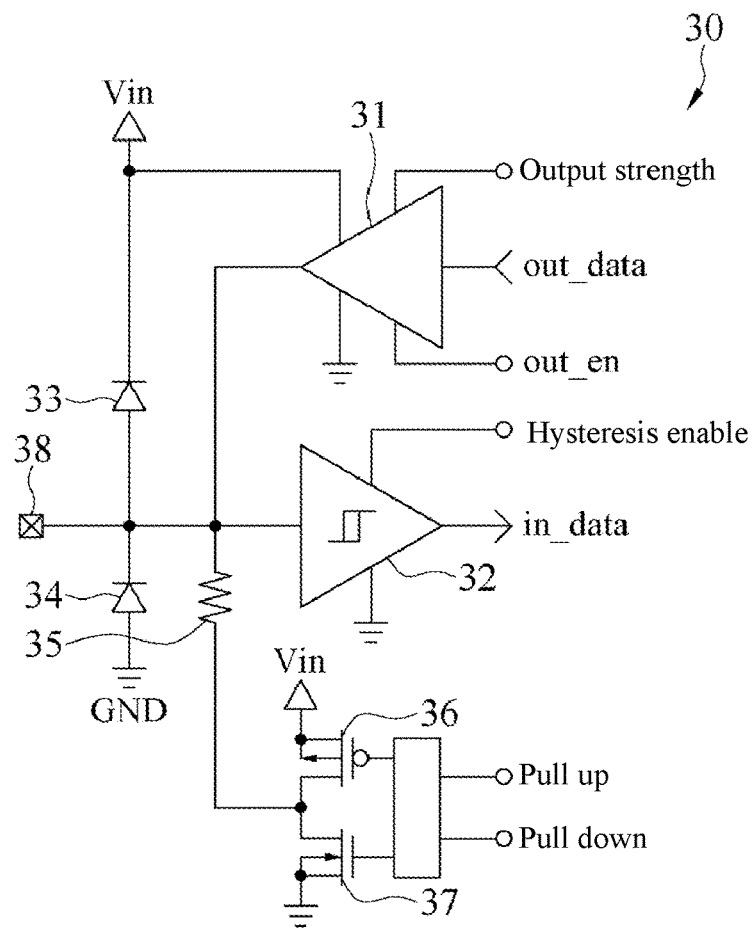
FIG. 4 is a schematic diagram of an actual circuit of a general-purpose input/output circuit applied to the present invention.

In an embodiment, the weakly pull circuit 16 may be any electronic circuit that can maintain the high logic level or the low logic level of the transmission path. As shown in FIG. 4, a general-purpose input/output circuit (GPIO circuit) 30 includes an output buffer 31, an input buffer 32, two diodes 33 and 34 connected in series, a resistor 35, a P-type metal oxide semiconductor (PMOS) transistor 36, an N-type metal oxide semiconductor (NMOS) transistor 37, and an input/output pin (I/O pin) 38. The I/O pin 38 is electrically connected to the output buffer 31, the input buffer 32, the diode 33, the diode 34, and the resistor 35, and the resistor 35 is electrically connected to the P-type metal oxide semiconductor 36 and the N-type metal oxide semiconductor 37. The output buffer 31 is used to increase output thrust, and the input buffer 32 is used to increase input thrust. The diode 33 and the diode 34 can resolve problems of electrostatic discharge (ESD) and electrical overstress (EOS). The diode 33 can prevent a high voltage signal from entering through the I/O pin 38, and the diode 34 can prevent a low voltage signal from entering through the I/O pin 38. In a push-pull mode of the general-purpose input/output circuit 30, the I/O pin 38 actively pulls up or down a level. In the push-pull mode, a current flows through the resistor 35 to the P-type metal oxide semiconductor 36 and the N-type metal oxide semiconductor 37, to pull up the level faster through the P-type metal oxide semiconductor 36 or pull down the level faster through the N-type metal oxide semiconductor 37.

Referring to FIG. 1, FIG. 3 and FIG. 4, the transmission path 22 between the second power domain 14 and the first power domain 12 in the present invention is unidirectional. Therefore, in the present invention, the general-purpose input/output circuit 30 may be respectively set as a general-purpose output (GPO) circuit used in the second power domain 14 or a general-purpose input (GPI) circuit used in the first power domain 12, and the general-purpose input/output circuit 30 located in the first power domain 12 serves as the weakly pull circuit 16. The general-purpose input/output circuit 30 is an analog circuit, and is controlled by internal digital logic of the first power domain 12 or the second power domain 14.

Figure 5:
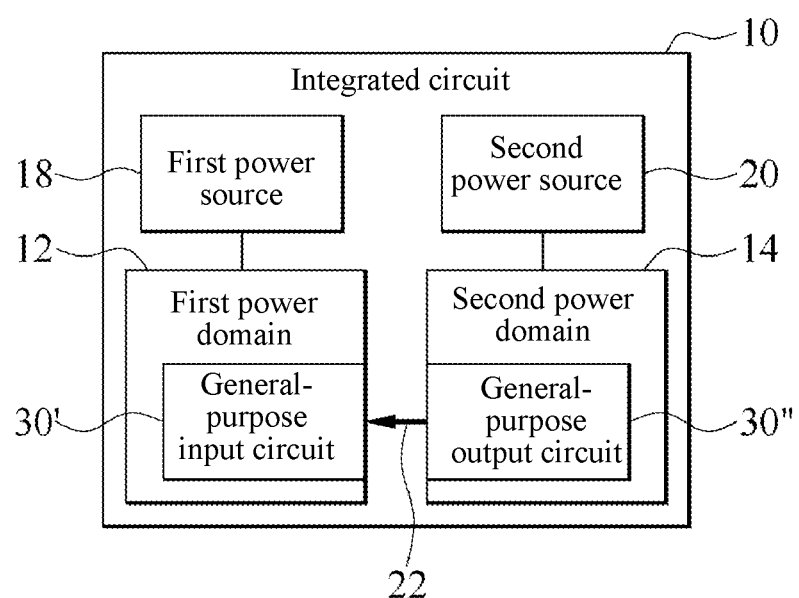
FIG. 5 is a block diagram of an integrated circuit according to still another embodiment of the present invention.

Referring to FIG. 4 and FIG. 5, one general-purpose input/output circuit 30 is disposed in the first power domain 12 and is set as a general-purpose input circuit 30', and the general-purpose input circuit 30' receives power from the first power source 18. The general-purpose input circuit 30' may serve as the weakly pull circuit 16 shown in FIG. 1 or FIG. 3. Another general-purpose input/output circuit 30 is also disposed in the second power domain 14 and is set as a general-purpose output circuit 30", and the general-purpose output circuit 30" receives power from the second power source 20. In the general-purpose input/output circuit 30, an enable signal out_en is output by digital logic to the general-purpose input/output circuit 30, to determine whether the general-purpose input/output circuit 30 serves as the general-purpose input circuit 30' or the general-purpose output circuit 30". For example, the internal digital logic of the first power domain 12 outputs an enable signal out_en=0 to the general-purpose input/output circuit 30 in the first power domain 12 to set the general-purpose input/output circuit 30 as the general-purpose input circuit 30'. The internal digital logic of the second power domain 14 outputs an enable signal out_en=1 to the general-purpose input/output circuit 30 in the second power domain 14 to set the general-purpose input/output circuit 30 as the general-purpose output circuit 30". During normal working (normal power supply), output data out_data to be output by the second power domain 14 is transmitted to the first power domain 12 on the transmission path 22 through the output buffer 31 and the I/O pin 38 in the general-purpose output circuit 30", and the first power domain 12 receives the output data out_data through the I/O pin 38 and the input buffer 32 in the general-purpose input circuit 30' as input data in_data of the first power domain 12. In a power-saving state, the first power domain 12 is still in the power-on mode, and the second power source 20 stop supplying power to the second power domain 14 so that the second power domain 14 is in the power-off mode. In this case, the general-purpose input circuit 30' may be weakly pulled low and maintain the transmission path 22 stably at the low logic level through the I/O pin 38. Therefore, when the second power domain 14 is in the power-off mode without any drive, the I/O pin 38 in the first power domain 12 is pulled up to a power source Vin or pulled down to the ground GND depending on an actual circuit, to pull up the level to maintain the transmission path 22 stably at the high logic level or pull down the level to maintain the transmission path stably at the low logic level, thereby preventing unknown signals from entering the first power domain 12 from the second power domain 14 and disturbing the normal operation of the first power domain 12.

Therefore, a circuit design is directly carried out inside the integrated circuit in the present invention, to use the weakly pull circuit to maintain the transmission path stably at a logic level when a power domain is powered off, thereby preventing unknown signals (including noise) from entering another power domain from the power domain in the power-off mode and disturbing the logic operation of the power domain, to maintain the normal operation of the integrated circuit. Therefore, an isolation cell is not required in the present invention, and a cumbersome isolation setting procedure is not required and a power-off time does not need to be learned in advance. In this way, even if one power domain encounters a sudden power-off event, the logic operation of another power domain is not affected.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:
1. An integrated circuit, comprising:
a first power domain powered by a first power source;
a second power domain powered by a second power source, the second power domain transmitting a signal to the first power domain through a transmission path; and
a weakly pull circuit signally connected to the transmission path, when the second power domain is in a power-off mode, the weakly pull circuit maintaining the transmission path stably at a logic level.
2. The integrated circuit according to claim 1, wherein the first power domain has a first connection pad, the second power domain has a second connection pad, and the second connection pad is electrically connected to the first connection pad to form the transmission path.
3. The integrated circuit according to claim 2, wherein the weakly pull circuit is located in the first power domain and is electrically connected to the first connection pad.
4. The integrated circuit according to claim 1, wherein the weakly pull circuit is a weakly pull-high circuit or a weakly pull-low circuit.
5. The integrated circuit according to claim 4, wherein when the weakly pull circuit is the weakly pull-low circuit, the logic level is a low logic level.
6. The integrated circuit according to claim 4, wherein when the weakly pull circuit is the weakly pull-high circuit, the logic level is a high logic level.
7. The integrated circuit according to claim 1, wherein the first power domain is in a power-on mode, and the second power domain is in the power-on mode or the power-off mode.

8. The integrated circuit according to claim 1, wherein the first power source and the second power source are a same power source.

9. A signal transmission method, applicable to an integrated circuit, the integrated circuit comprising a first power domain and a second power domain, and the signal transmission method comprising:
supplying, by a first power source, power to the first power domain, and supplying, by a second power source, power to the second power domain;
transmitting, by the second power domain, a signal to the first power domain through a transmission path; and
when the second power domain is in a power-off mode, maintaining, by a weakly pull circuit, the transmission path stably at a logic level.

10. The signal transmission method according to claim 9, wherein the weakly pull circuit is located in the first power domain, and is signally connected to the transmission path.

11. The signal transmission method according to claim 9, wherein the weakly pull circuit is a weakly pull-high circuit or a weakly pull-low circuit.

12. The signal transmission method according to claim 11, wherein when the weakly pull circuit is the weakly pull-low circuit, the logic level is a low logic level.

13. The signal transmission method according to claim 11, wherein when the weakly pull circuit is the weakly pull-high circuit, the logic level is a high logic level.

14. The signal transmission method according to claim 9, wherein the first power domain is in a power-on mode, and the second power domain is in the power-on mode or the power-off mode.

15. The signal transmission method according to claim 9, wherein the first power source and the second power source are a same power source.

* * * * *